(12) United States Patent
Yu et al.

(10) Patent No.: US 6,344,632 B1
(45) Date of Patent: Feb. 5, 2002

(54) ROUND HEATING PLATE USED IN A HEATING CHAMBER FOR SEMICONDUCTOR DEVICE MANUFACTURING

(75) Inventors: Seung-il Yu; Jung-kyu Lee, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 08/962,451

(22) Filed: Oct. 31, 1997

(30) Foreign Application Priority Data

Nov. 13, 1996 (KR) .............................................. 96-53762

(51) Int. Cl.$^7$ ................................................. H05B 3/68
(52) U.S. Cl. ..................................... 219/444.1; 118/725
(58) Field of Search .......................... 219/443.1, 444.1, 219/465.1, 466.1, 468.1, 504, 385; 118/723 VE, 725, 726, 727

(56) References Cited

U.S. PATENT DOCUMENTS

| 4,926,025 | A | * | 5/1990 | Wilhelm | 219/505 |
| 5,059,770 | A | * | 10/1991 | Mahawili | 219/444.1 |
| 5,294,778 | A | * | 3/1994 | Carman et al. | 219/444.1 |
| 5,635,093 | A | * | 6/1997 | Arena et al. | 219/443.1 |
| 5,753,891 | A | * | 5/1998 | Iwata et al. | 219/390 |

* cited by examiner

Primary Examiner—Sang Paik
(74) Attorney, Agent, or Firm—Volentine Francos, PLLC

(57) ABSTRACT

A round heating plate for a heating chamber used in semiconductor device manufacturing provides uniform heating of the wafer from its center to its outside edges. The round heating plate includes a small-diameter round heating element and multiple ring-shaped elements arranged concentrically therewith. The round heating plate has the same shape as the wafer, and in the heating chamber, a pair of round heating plates is arranged so as to be concentric with a pair of wafers to be heated. During heating, the wafers are installed in a space formed between the heating plates.

7 Claims, 5 Drawing Sheets

ROUND HEATING PLATE USED IN A HEATING CHAMBER FOR SEMICONDUCTOR DEVICE MANUFACTURING

BACKGROUND OF THE INVENTION

1. Field of the Invention

The present invention relates to a round heating plate used in a heating chamber for heating a semiconductor wafer to a predetermined temperature. The present invention also relates to a heating chamber for semiconductor device manufacturing, in which a pair of round heating plates is located so as to be concentric with a pair of wafers when the wafers are installed in the heating chamber, in order to heat the wafers uniformly.

2. Background of the Related Art

In semiconductor device manufacturing, a wafer undergoes several important heat treatments, usually for purposes such as defect removal, active device fabrication and interconnect formation.

Thermal treatments are divided into classifications such as high pressure oxidization, low temperature processing and short time, high temperature processing.

A Rapid Thermal Processing System (RTP) is generally used for short time, high temperature processing. The RTP may use either a single zone heater such as a bell jar type, or a dual wafer system. A dual wafer system is illustrated in FIG. 1 and FIG. 2, which includes a heating chamber 1 and a robot arm 3.

To obtain uniform heating of the wafer in the single zone heater, the inside of the chamber should closely approximate a black body, and for this, the length and width should be large. Due to the impossibility of constricting a chamber with infinite dimensions, temperature varies according to the location of the wafer in the chamber.

In the case of the dual wafer system, two heating plates 2 are secured to a housing 1 of the heating chamber, so as to define a space where an upper wafer 4 and a lower wafer 4' are heated simultaneously. The heating plates 2 have a perfect square shape as shown in FIG. 3. Therefore, it is impossible to heat the wafers 4 and 4' evenly, and it is hard to form a layer on each wafer uniformly.

As shown in FIGS. 4 and 5, when the wafers 4 and 4' are heated to a specified temperature, for example either 760° C. or 820° C. in a nitrogen atmosphere, the temperature at the center of each wafer 4, 4' and the temperatures at other locations on the wafer may be different. The temperature distributions on wafers 4, 4' heated with a square heating plate to 760° C. and 820° C. are shown in FIGS. 4 and 5, respectively. As can be seen from FIGS. 4 and 5, the temperature deviates from the center of the wafer to the edge of the wafer. Temperature deviations measured front to back and left to right can be seen by following the solid and dotted lines connecting the open circles and triangles for the upper wafer 4, and connecting the solid circles and triangles for the lower wafer 4'. Therefore, it is undesirable to heat a round wafer 4 with a square heating plate 2.

SUMMARY OF THE INVENTION

Accordingly, the present invention is directed to a round heating plate for use in the heating chamber for semiconductor device manufacturing, which heats the wafer evenly. The present invention is also directed to a heating chamber in which a pair of round heating plates have been secured, forming a space between the heating plates into which a pair of wafers is installed for heating. The round heating plate for use in a heating chamber for semiconductor device manufacturing provides for formation of uniform layers on the surface of the wafer through uniform heating of the wafer.

Additional features and advantages of the invention will be set forth in the description which follows, and in part will be apparent from the description, or may be learned through practice of the invention. The objectives and other advantages of the invention will be realized and attained by the structure, particularly pointed out in the written description and claims hereof as well as the appended drawings.

To achieve these and other advantages in the dual wafer system heating chamber, where the wafer is heated, and in accordance with the purpose of the present invention as embodied and broadly described, the round heating plate for use in a heating chamber for semiconductor device manufacturing has the same shape as the wafer to be heated.

The round heating plate can be a resistance heating plate which heats the wafer through electrical resistance heating. The round heating plate is located such that the wafer is concentric with the heating plate during heating. The diameter of the round heating plate is preferably 1.1 to 1.6 times that of the wafer.

The round heating plate may comprise one small diameter round heating plate and multiple ring-shaped heating plates arranged concentrically, in which case an inner surface of the inner-most ring-shaped heating plate is adjacent to an outer surface of the small diameter round heating plate.

Ideally, the ring-shaped heating plate should comprise two to six separate ring-shaped heating plate, wherein the ring-shaped heating plate are arranged so that the outer surface of each ring-shaped heating plate is adjacent to the inner surface of the next larger ring-shaped heating plate.

In the round heating plates and ring-shaped heating plates, temperature can be controlled using variable resistors.

It is to be understood that both the foregoing general description and the following detailed description are intended to provide further explanation of the invention as claimed.

BRIEF DESCRIPTION OF THE ATTACHED DRAWINGS

The accompanying drawings illustrate embodiments of the invention, in which.

DETAILED DESCRIPTION OF PREFERRED EMBODIMENT

Reference will now be made in detail to the preferred embodiments of the present invention, examples of which are illustrated in the accompanying drawings.

Figure 6:
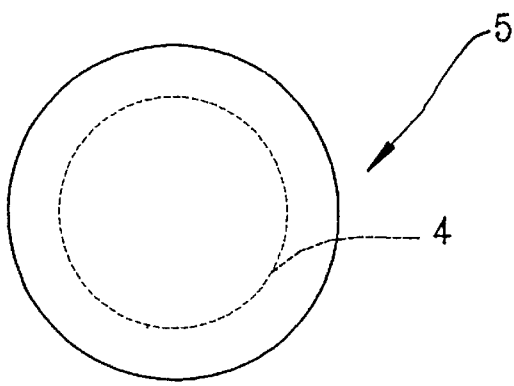
FIG. 6 is a top view of a round heating plate utilized in the heating chamber for semiconductor device manufacturing in accordance with an embodiment of the present invention.

As illustrated in FIG. 6, the round heating plate in the heating chamber for semiconductor device manufacture includes a round heating plate 5 in a flat disk shape like round wafer 4 (shown in dotted lines), which can heat wafer 4 evenly.

Round heating plate 5 is heated electrically by resistance heating which heats by means of resistance to the flow of an electric current. Electric resistance heaters are well known and commonly available.

Figure 1:
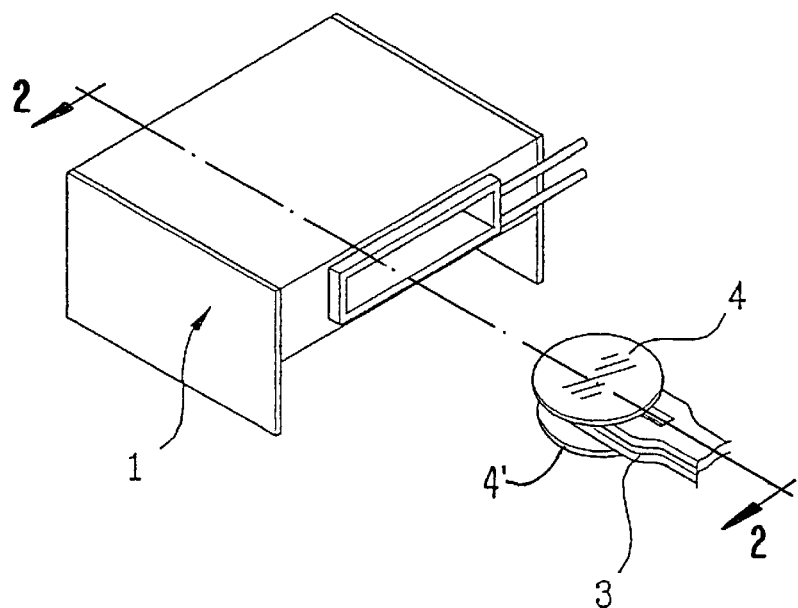
FIG. 1 is a perspective view of a conventional heating chamber and robot arm for semiconductor device manufacturing.
Figure 2:
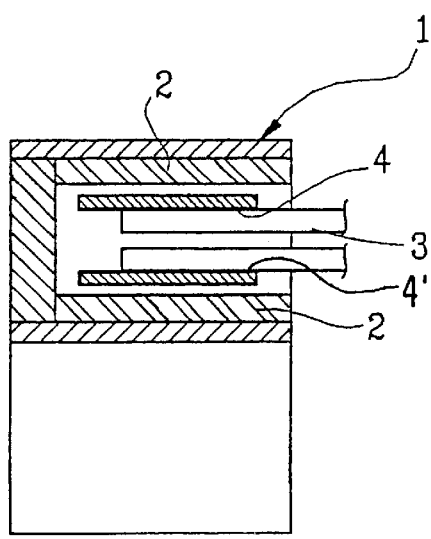
FIG. 2 is a cross-sectional view along the line 2—2 in FIG. 1, with the robot arm and wafers shown positioned inside the heating chamber.
Figure 3:
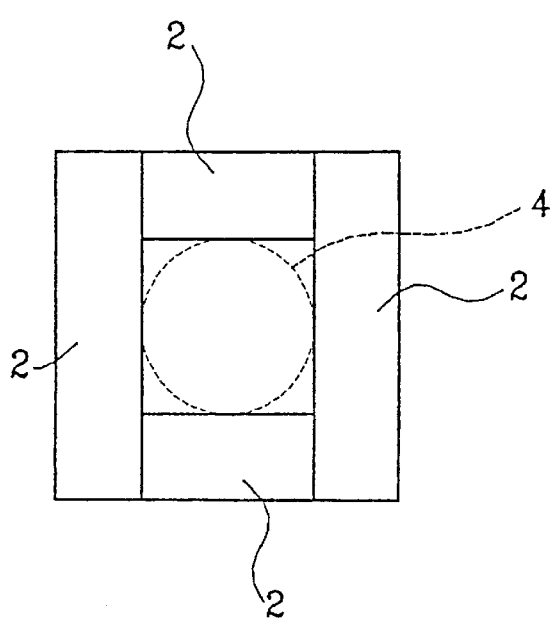
FIG. 3 is a top view of a typical square heating plate used in the heating chamber of FIG. 1.

Two round heating plates 5 should be secured in a heating chamber housing similar to housing 1 shown in FIGS. 1 and 2, so as to define a space into which a pair of wafers should be installed for heating. The heating plates 5 should be located so as to be concentric with the wafers during heating thereof, in order to ensure even heating.

The diameter of the round heating plate 5 should preferably be 1.1 to 1.6 times that of the wafer 4 which is heated in order to prevent heat loss resulting from radiation at the edge of the round wafer 4.

When the diameter of the round heating plate 5 is less than 1.1 times that of the wafer 4, the wafer 4 may be not heated evenly due to the heat losses at the edge thereof. When over 1.6 times, the excess part which is not related to the heating directly can result in energy loss and prolongation of cooling time.

Figure 7:
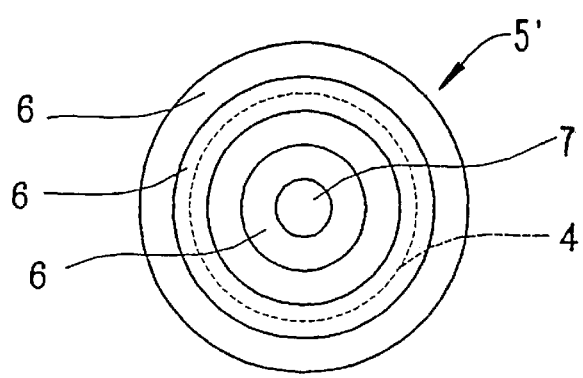
FIG. 7 is a top view of a second embodiment of the round heating plate of the present invention.

As shown in FIG. 7, a second embodiment of the round heating plate 5' comprises one small diameter round heating plate 7 and a ring-shaped heating plate 6 which may comprise a plurality of ring-shaped plates 6, which are arranged concentrically. Also, in this embodiment, the inner circumference of the inner-most ring-shaped plate 6 is adjacent to the outer circumference of the one small diameter round heating plate 7. Like the round heating plate 5 in the first embodiment, the small diameter round heating plate 7 and the ring-shaped heating plates 6 are heated by resistance heating which generates heat by means of resistance to the flow of electric current.

Ideally, the plurality of ring-shaped heating plates 6 should be two to six in number. When there are less than two ring-shaped heating plates 6, a wave-shaped temperature profile (i.e., have peaks and valleys) is generated when temperature is measured at the center of the wafer 4 and at various points extending to the edges of the wafer, because the temperature deviations on the wafer 4 in accordance with the location of the ring-shaped heating plates 6 are large.

With more than six heating plate, it is difficult to maintain a concentric arrangement of the heating plates adjacent to one another and to control the temperature of the wafer 4 exactly, because the simultaneous temperature adjustment of more than six ring-shaped heating plate 6 is complicated.

Where the round heating plate 5' comprises a small diameter round heating plate 7 and multiple ring-shaped heating plates 6, the multiple ring-shaped heating plate 6 are arranged concentrically such that the outer circumference of each ring-shaped heating plate 6 is placed adjacent to the inner circumference of the next larger ring-shaped heating plate 6, until the outside ring-shaped plate is in place.

In the small diameter round heating plate 7 and the ring-shaped heating plates 6, temperature can be controlled with variable resistors, with which the amount of heat generated is controlled by adjusting the resistance and hence the current.

Figure 4:
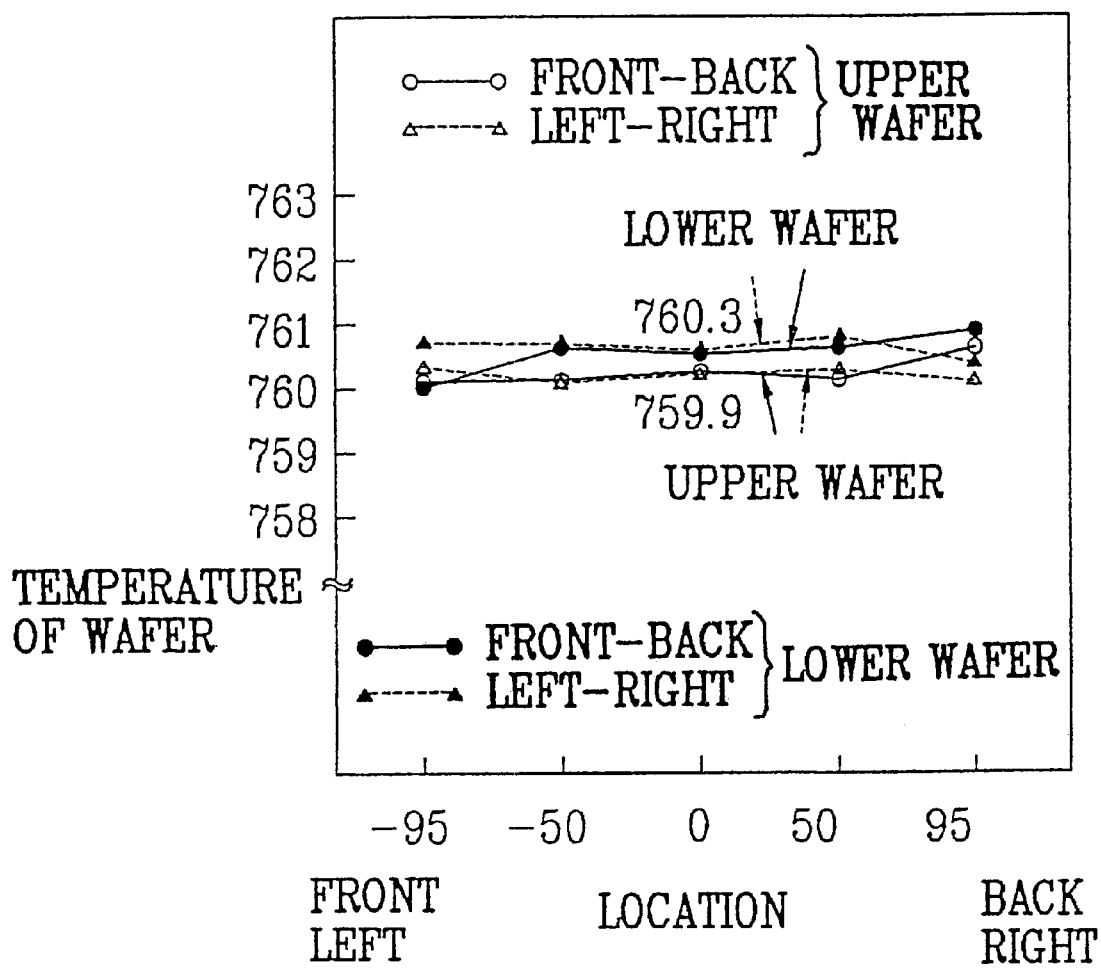
FIG. 4 is a graph showing temperature distribution according to the location on wafers which are heated to 760° C. by two of the square heating plates of FIG. 3.
Figure 5:
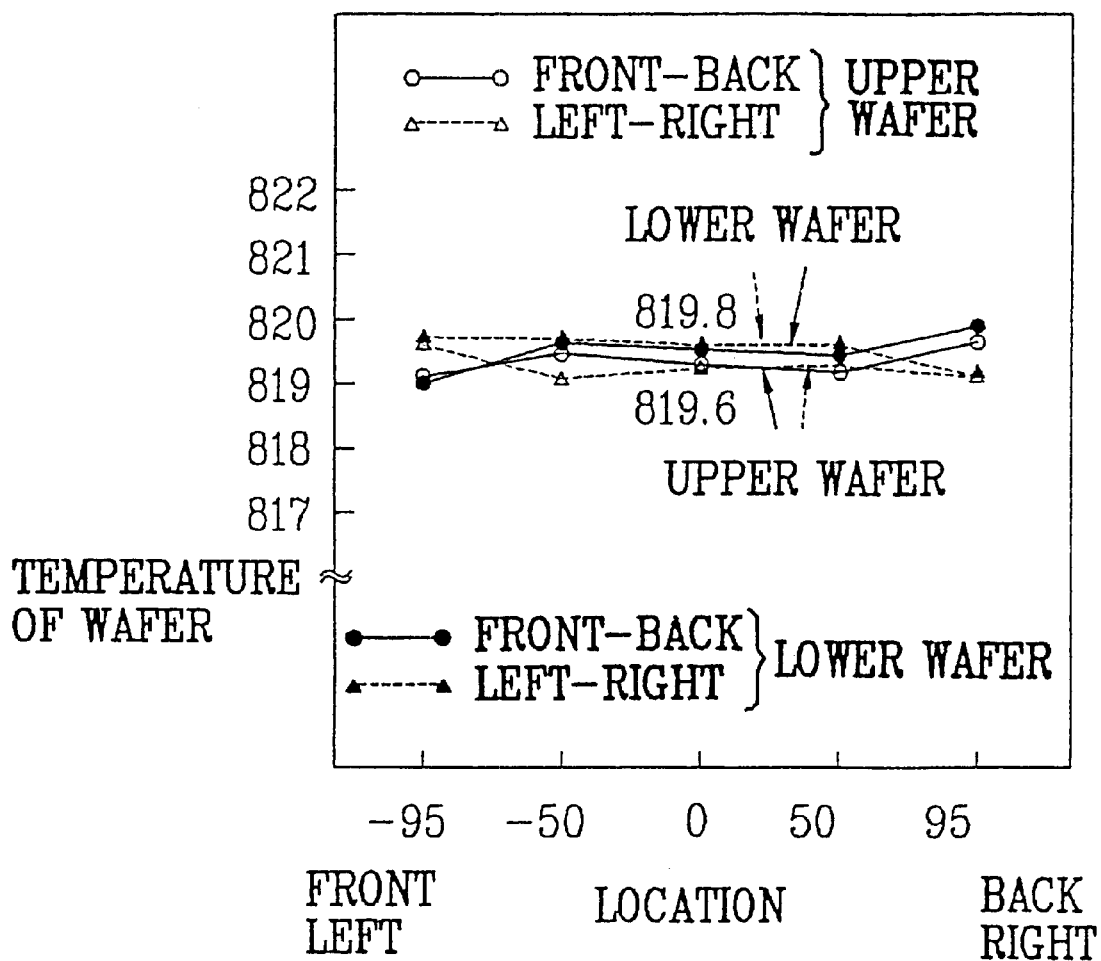
FIG. 5 is a graph showing temperature distribution according to the location on wafers which are heated to 820° C. by two of the square heating plates of FIG. 3.
Figure 8:
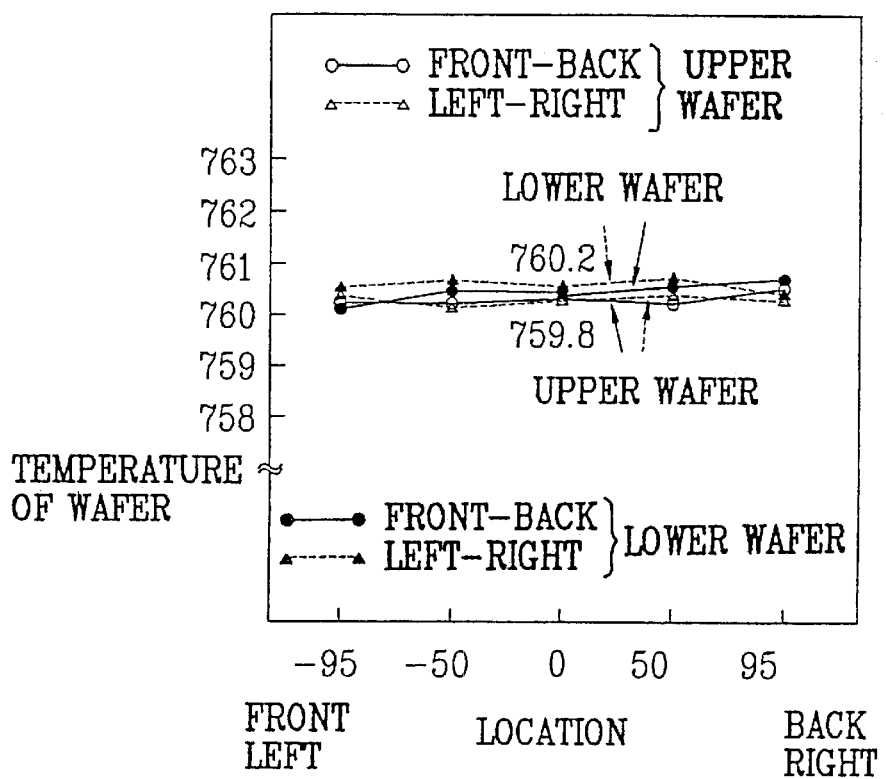
FIG. 8 is a graph showing the temperature distribution according to the location on wafers which are heated to 760° C. by two of the round heating plates of FIG. 7.
Figure 9:
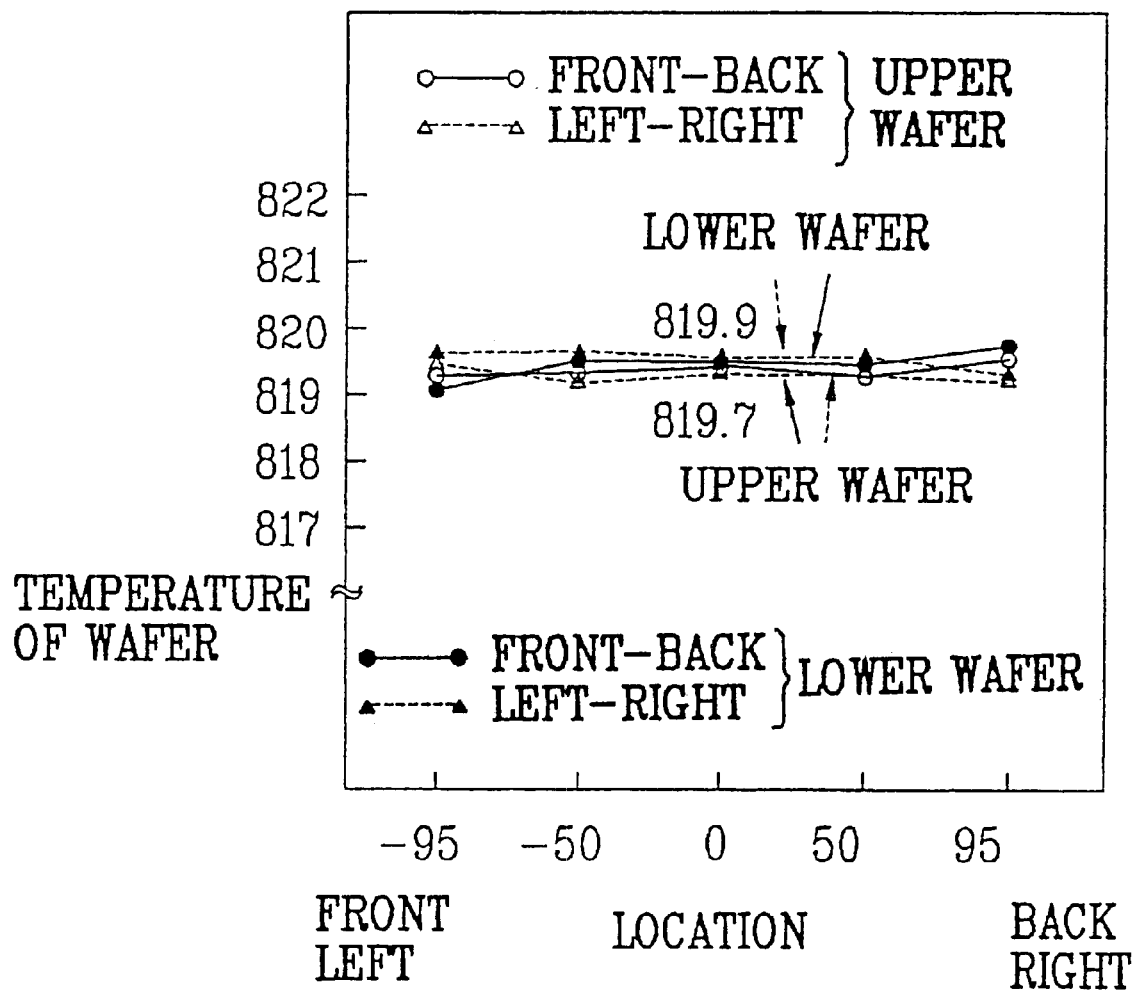
FIG. 9 is a graph showing temperature distribution according to the location on wafers which are heated to 820° C. by two of the round heating plates of FIG. 7.

Referring to FIGS. 8 and 9, when an upper wafer and a lower wafer are heated in a heating chamber using the round heating plate 5' illustrated in FIG. 7, to a specified temperature for example either 760° C. (FIG. 8) or 820° C. (FIG. 9) in a nitrogen atmosphere, temperature distributions on the wafer may be compared to those obtained using the conventional square heating plate 2 as shown in FIGS. 4 and 5. As shown in FIGS. 8 and 9, the temperature deviation between the center of the wafer and the edges of the wafer is very small, so that the temperatures measured at various locations front to back and left to right on the wafer are almost the same.

Also, the temperature deviation between the center and four directions of each wafer which is heated is less than the temperature deviations obtained using the conventional square heating plate 2. Therefore, the temperature deviation between the center and the four directions of the wafer 4 can be reduced by using the round heating plate of the present invention.

With the present invention, the surface of wafer 4 can be heated evenly due to the use of the round heating plate 5 or 5'. Also, the formation of a uniform layer on the surface of wafer 4 is possible due to uniform heating of the surface of wafer 4 resulting in a high semiconductor device yield.

It will be apparent to those skilled in the art that various modifications and variations can be made in the round heating plate for use in a heating chamber for semiconductor device manufacturing of the present invention without departing from the spirit or scope of the invention. Thus, it is intended that the present invention cover modifications and variations of this invention provided they come within the scope of the appended claims and their equivalents.

What is claimed is:

1. A heating plate for use in a heating chamber where a wafer is to be heated for semiconductor device manufacturing, comprising one small-diameter round heating plate, and a plurality of ring-shaped heating plates, wherein the ring-shaped heating plates are arranged concentrically with each other and with the small-diameter round heating plate, and when the heating plates are installed in the heating chamber, one surface of the heating plates directly faces the wafer to be heated without contacting each other,
an outer circumference of said small-diameter round heating plate being arranged adjacent to and in contact with an inner circumference of a smallest of said plurality of ring-shaped heating plates.

2. The heating plate as claimed in claim 1, wherein the heating plate is an electrical resistance heating plate.

3. The heating plate as claimed in claim 1, wherein the heating plate is located so as to be concentric with the wafer when the wafer is installed in the heating chamber.

4. The heating plate as claimed in claim 1, wherein a diameter of the heating plate is 1.1 to 1.6 times that of the wafer which is to be heated.

5. The heating plate as claimed in claim 1, wherein an outer circumference of the smallest ring-shaped heating plate is arranged adjacent to and in contact with an inner circumference of a second ring-shaped heating plate, and an outer circumference of the second ring-shaped heating plate is similarly arranged adjacent to and in contact with an inner circumference of a third ring-shaped heating plate, if any, until a largest ring-shaped heating plate has been put into place.

6. The heating plate as claimed in claim 1, wherein said plurality of ring-shaped heating plates comprise two to six heating plates.

7. The heating plate as claimed in claim 1, wherein a temperature generated by each heating plate is independently controlled using variable resistors.

* * * * *